United States Patent
Hsiao et al.

(10) Patent No.: US 10,059,631 B2
(45) Date of Patent: Aug. 28, 2018

(54) MICROPOWDER AND METHOD FOR MANUFACTURING THE SAME

(71) Applicant: INDUSTRIAL TECHNOLOGY RESEARCH INSTITUTE, Hsinchu (TW)

(72) Inventors: Ta-Ching Hsiao, Zhudong Township (TW); Wen-Po Tu, Zhudong Township (TW); Chu-Pi Jeng, Hsinchu (TW); Mu-Hsi Sung, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/386,749

(22) Filed: Dec. 21, 2016

(65) Prior Publication Data
US 2018/0134625 A1    May 17, 2018

(30) Foreign Application Priority Data
Nov. 15, 2016   (TW) .............................. 105137205 A

(51) Int. Cl.
*C04B 35/573* (2006.01)
*C04B 35/628* (2006.01)
(Continued)

(52) U.S. Cl.
CPC ............ *C04B 35/573* (2013.01); *C01B 31/36* (2013.01); *C04B 35/6267* (2013.01);
(Continued)

(58) Field of Classification Search
None
See application file for complete search history.

(56) References Cited

U.S. PATENT DOCUMENTS

| 8,864,045 B1 | 10/2014 | Jiang et al. |
| 8,951,638 B2 | 2/2015 | Katou et al. |

(Continued)

FOREIGN PATENT DOCUMENTS

| CN | 102172501 A | 9/2011 |
| JP | 2000-297301 A | 10/2000 |

(Continued)

OTHER PUBLICATIONS

Koc et al.; Synthesis of Beta Silicon Carbide Powders Using Carbon Coated Fumed Silica; Journal of Materials Science; 33, 2537-2549; 1998.*

(Continued)

*Primary Examiner* — Guinever S Gregorio
(74) *Attorney, Agent, or Firm* — Birch, Stewart, Kolasch & Birch, LLP

(57) ABSTRACT

A method for manufacturing micropowder is provided, which includes (a) mixing a silicon precursor and a carbon precursor to form a mixture, and heating and keeping the mixture at 1600° C. to 1800° C. under a vacuum and non-oxygen condition for 120 to 180 minutes to form a silicon carbide powder; and (b) heating and keeping the silicon carbide powder at 1900° C. to 2100° C. under non-oxygen condition for 5 to 15 minutes, and then cooling and keeping the silicon carbide powder at 1800° C. to 2000° C. under the non-oxygen condition for 5 to 15 minutes to form micropowder, wherein the micropowder includes a silicon carbide core covered by a carbon film.

7 Claims, 9 Drawing Sheets

(51) Int. Cl.
  *C04B 35/626* (2006.01)
  *C01B 31/36* (2006.01)
  *C30B 23/00* (2006.01)
  *C30B 29/36* (2006.01)

(52) U.S. Cl.
  CPC .......................... *C04B 35/62839* (2013.01); *C04B 2235/5436* (2013.01); *C04B 2235/656* (2013.01); *C04B 2235/6567* (2013.01); *C04B 2235/6584* (2013.01); *C30B 23/00* (2013.01); *C30B 29/36* (2013.01)

(56) References Cited

U.S. PATENT DOCUMENTS

| | | | |
|---|---|---|---|
| 9,023,308 | B2 | 5/2015 | Shankman |
| 2006/0165988 | A1 | 7/2006 | Chiang et al. |
| 2010/0297502 | A1 | 11/2010 | Zhu et al. |
| 2010/0320437 | A1 | 12/2010 | Gordon et al. |
| 2014/0127115 | A1* | 5/2014 | Kim .................. C01B 31/36 423/345 |
| 2014/0367897 | A1* | 12/2014 | Shin .................. C01B 31/36 264/682 |
| 2015/0197871 | A1 | 7/2015 | Min |
| 2015/0303462 | A1 | 10/2015 | Leconte et al. |

FOREIGN PATENT DOCUMENTS

| | | |
|---|---|---|
| JP | 2011-102205 A | 5/2011 |
| KR | 10-2014-0069993 A | 6/2014 |
| TW | 201504488 A | 2/2015 |
| WO | WO 2015/068976 A1 | 5/2015 |

OTHER PUBLICATIONS

Taiwanese Office Action and Search Report, dated Aug. 3, 2017, for Taiwanese Application No. 105137205.

Bickermann et al., "Incorporation of boron and vanadium during PVT growth of 6H-SiC crystals," Elsevier, Journal of Crystal Growth, vol. 233, Issues 1-2, Nov. 2001, pp. 211-218.

Choudhary et al., "Theoretical study on transport properties of a BN co-doped SiC nanotube," Elsevier, Physics Letters A, vol. 375, Issue 38, 2011 (available online Aug. 4, 2011), pp. 3382-3385.

Jayatirtha et al., "Improvement in the growth rate of cubic silicon carbide bulk single crystals grown by the sublimation method," Elsevier, Journal of Crystal Growth, vol. 174, Issues 1-4, Apr. 2, 1997, pp. 662-668.

Linnarsson et al., "Solubility limit and precipitate formation in Al-doped 4H-SiC epitaxial material," Applied Physics Letters, vol. 79, No. 13, Sep. 24, 2001, pp. 2016-2018 (4 pages).

Miyata et al., "Ab initio study of substitutional impurity atoms in 4H-SiC," Journal of Applied Physics, vol. 104, Issue 12, 2008 (published online Dec. 16, 2008), pp. 123702-1 to 123702-4 (5 pages).

Ramm et al., "Optimization of sublimation growth of SiC bulk crystals using modeling," Elsevier, Materials Science and Engineering: B, vols. 61-62, Jul. 1999, pp. 107-112 (7 pages).

Selder et al., "Global numerical simulation of heat and mass transfer for SiC bulk crystal growth by PVT," Elsevier, Journal of Crystal Growth, vol. 211, Issues 1-4, Apr. 1, 2000, pp. 333-338.

Straubinger et al., "Aluminum p-type doping of silicon carbide crystals using a modified physical vapor transport growth method," Elsevier, Journal of Crystal Growth, vol. 240, Issues 1-2, Apr. 2002, pp. 117-123.

Sudarshan et al., "Bulk growth of single crystal silicon carbide," Elsevier, Microelectronic Engineering, vol. 83, Issue 1, 2006 (available online Nov. 18, 2005), pp. 155-159.

Wang et al., "A novel method to increase the growth rate in sublimation crystal growth of advanced materials," Elsevier, International Journal of Heat and Mass Transfer, vol. 50, Issues 7-8, 2007 (available online Nov. 29, 2006), pp. 1221-1230.

\* cited by examiner

MICROPOWDER AND METHOD FOR MANUFACTURING THE SAME

CROSS REFERENCE TO RELATED APPLICATIONS

The present application is based on, and claims priority from, Taiwan Application Serial Number 105137205, filed on Nov. 15, 2016, the disclosure of which is hereby incorporated by reference herein in its entirety.

TECHNICAL FIELD

The technical field relates to silicon carbide powder and a method for manufacturing the same.

BACKGROUND

Single crystal silicon carbide is very promising in the application of new generation electronic substrates due to its excellent optical, electrical, and thermal properties, such as high breakdown voltage, wide energy gap, high electron drift velocity, and high thermal conductivity, etc.

At present, physical vapor transport (PVT) method is the mainstream technology for growing silicon carbide crystals, which utilizes high purity silicon carbide powder as a raw material. The silicon carbide powder is sublimated at a temperature higher than 2000° C., and the sublimated gaseous molecules are deposited on a low-temperature crystal seed through a temperature field, thereby growing the crystal. The silicon carbide powder serves as the raw material in crystal growth, and its quality directly influences the properties of the crystal that is grown. The purity of the silicon carbide powder is normally considered, because the impurities in the powder will be transferred into the crystal during crystal growth, so as to induce defects in the silicon carbide crystal and affect the electrical properties of the crystal. In addition, the powder topography is one of the factors that will affect crystal growth, and the powder diameter is the key factor for determining the stability and speed of crystal growth.

In general, currently, there are two methods to produce the silicon carbide powder, one is the Acheson method, in which silicon oxide reacts with petroleum coke at a temperature of at least 2500° C. to form a silicon carbide bulk. The bulk is physically crushed and ground to form silicon carbide powder. While the bulk is grown in the atmosphere, it is difficult to control the purity. The purity of the powder is limited by the abrasive contamination during the grinding process. The other method is chemical vapor deposition (CVD), which uses a high purity silicon precursor and a high purity carbon precursor (e.g. $SiH_4$ and $C_3H_8$) gases under a vacuum environment. The gaseous molecules of the precursors are decomposed and then react to form silicon carbide powder. The gaseous precursor materials used in this method are of a high purity, so that the silicon carbide powder is also with high purity. However, the powder diameter is too small, so that the crystal growth process becomes difficult. In addition, the yield of the synthesized powder by the CVD method is low, and the cost is too high to be easily commercialized.

Accordingly, an innovative method for manufacturing silicon carbide micropowder is called for.

SUMMARY

One embodiment of the disclosure provides a method for manufacturing micropowder, comprising: (a) mixing a silicon precursor and a carbon precursor to form a mixture, and heating and keeping the mixture at 1600° C. to 1800° C. under vacuum and non-oxygen condition for 120 to 180 minutes to form a silicon carbide powder; and (b) heating and keeping the silicon carbide powder at 1900° C. to 2100° C. under non-oxygen condition for 5 to 15 minutes, and then cooling and keeping the silicon carbide powder at 1800° C. to 2000° C. under the non-oxygen condition for 5 to 15 minutes to form micropowder, wherein the micropowder includes a silicon carbide core covered by a carbon film.

One embodiment of the disclosure provides micropowder, comprising: a silicon carbide core; and a carbon film covering the silicon carbide core, wherein the silicon carbide core has a diameter of 50 micrometers to 500 micrometers, and the carbon film has a thickness of 20 nm to 200 nm.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1A:
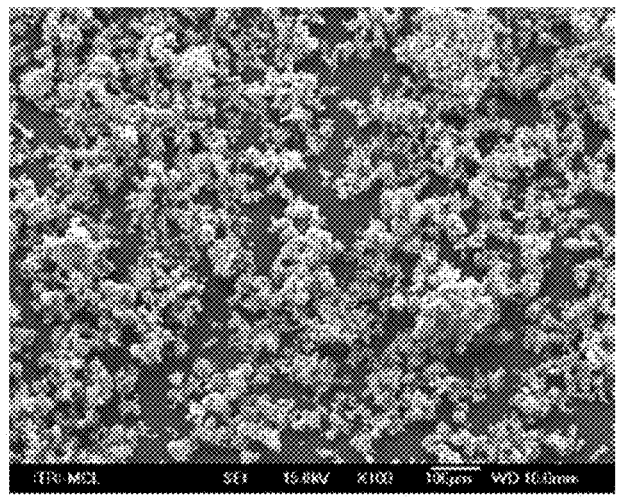
FIG. 1A shows a photograph of silicon carbide powder before reciprocating sublimation in one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

A skill for controlling the diameter of silicon carbide powder is provided, which may satisfy the requirement for stable and fast crystal growth. When a silicon carbide powder of high purity grown from conventional PVD has a smaller size, it may have a higher specific surface area. As such, the powder sublimation rate during crystal growth is higher, thereby easily enhancing the crystal growth rate. On the other hand, an overly small powder diameter also results in powder sintering due to its high surface energy, thereby blocking the transfer path (between the powders) of the sublimated gas. In addition, the crystal growth is performed under a high vacuum. Silicon carbide powder which is too small in particle size is easily raised by air flow, thereby increasing the powder process difficulty, and also changing the silicon carbide composition. Accordingly, some conventional crystal growth skills use a larger powder as a raw material to prevent the sintering problem and to ease the operation under vacuum. However, powder that is too large may reduce the powder sublimation rate, and it is difficult to enhance the crystal growth rate. Compared to the conventional methods, the silicon carbide powder of the disclosure is synthesized in a vacuum, and then treated by reciprocating sublimation. Because the small silicon carbide powder has a higher surface energy, it tends to shrink and disappear at high temperatures due to diffusion. Because the large silicon carbide powder has a lower surface energy, it is relatively stable at room temperature. As such, the diameter of the larger silicon carbide powder may gradually grow to several tens to several hundreds of micrometers at high temperatures. The method in the embodiments of the disclosure may control the diameter of the silicon carbide powder, and further provide the silicon carbide powder with a suitable diameter and diameter distribution.

In one embodiment of the disclosure, the method of forming micropowder includes (a) mixing a silicon precursor and a carbon precursor to form a mixture. Subsequently, the method includes heating and keeping the mixture at 1600° C. to 1800° C. under a vacuum and non-oxygen condition for 120 to 180 minutes to form a silicon carbide powder. If the heating temperature is too low and/or the mixture is not kept at the heating temperature for a long enough time, the reaction may not be complete, and the silicon carbide powder may mix with un-reacted precursors. Heating temperature that is too high and/or keeping the mixture at the heating temperature for too long may increase energy consumption, and the lifespan of the equipment (e.g. the crucible and the thermal insulation material) is also reduced. In one embodiment, the vacuum and non-oxygen condition has a pressure of 0.1 Torr to 50 Torr. If the pressure of the vacuum and non-oxygen condition is too low, too much the precursors may be consumed. Conversely, the reaction rate may be slowed down if the pressure of the vacuum and non-oxygen condition is too high, and a longer period will be needed for the silicon carbide powder to form. If oxygen exists in the vacuum, it will interfere the reaction generate oxide in the product. Moreover, the oxygen also dramatically reduces the lifespan of the graphite equipment (e.g. the crucible and the flame retardant material). The carbon precursor can be graphite, active carbon, asphalt, resin, alkane, alkene, another suitable carbon precursor, or a combination thereof. The silicon precursor can be silicon powder, silicon oxide powder, tetraethyl silicate, another suitable silicon precursor, or a combination thereof. In one embodiment, the silicon carbide powder produced in step (a) has a diameter of hundreds of nanometers to tens of micrometers, and an average diameter of 20 micrometers to 50 micrometers.

Thereafter, the method involves (b) heating and keeping the silicon carbide powder at 1900° C. to 2100° C. under non-oxygen condition for 5 to 15 minutes, and then cooling and keeping the silicon carbide powder at 1800° C. to 2000° C. under the non-oxygen condition for 5 to 15 minutes to form micropowder. Heating temperature that is too low and/or not keeping the silicon carbide powder at the heating temperature in step (b) long enough may lead to the formation of a micropowder that is too small. A heating temperature that is too high and/or keeping the silicon carbide powder at the heating temperature in step (b) for too long may increase the energy consumption, and the lifespan of the equipment (e.g. the crucible and the thermal insulation material) is also reduced. In one embodiment, the heating/cooling circle (e.g. reciprocating sublimation) can be repeated several times until the micropowder achieves the desired size. In one embodiment, step (b) can be repeated for a total of 60 to 120 minutes. If the total period of repeating step (b) is too short, the diameter of the micropowder will be too small. If the total period of repeating step (b) is too long, the energy consumption is increased, and the lifespan of the equipment (e.g. the crucible and the thermal insulation material) is also reduced. In one embodiment, the non-oxygen condition in step (b) includes an argon atmosphere with a pressure of 400 Torr to 760 Torr. If the pressure of the non-oxygen condition is too low, too much silicon carbide powder may be consumed. If the pressure of the non-oxygen condition is too high, this may slow down the reaction rate, and a longer period will be needed to form the micropowder. If oxygen is present in the non-oxygen condition, it may interfere the reaction and generate the oxide in the product. Moreover, the oxygen also dramatically reduces the lifespan of the graphite equipment (e.g. the crucible and the flame retardant material). The micropowder formed in step (b) includes a silicon carbide core, and a carbon film covering the silicon carbide core. The silicon carbide core has a diameter of 50 micrometers to 500 micrometers, and the carbon film has a thickness of 20 nm to 200 nm. In addition, the micropowder has photoluminescent properties. The micropowder can be excited by a light with a wavelength (excitation wavelength) of 325 nm to emit light with a wavelength (emission wavelength) of 400 nm to 550 nm. Compared to the silicon carbide powder formed in step (a), the micropowder formed in step (b) has a larger diameter and additional carbon film covering the silicon carbide core.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Example 1

Figure 1B:
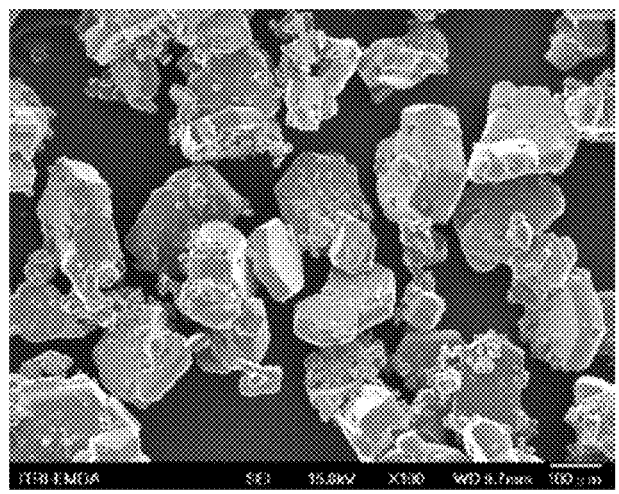
FIG. 1B shows a photograph of the silicon carbide powder after the reciprocating sublimation in one embodiment of the disclosure.
Figure 2:
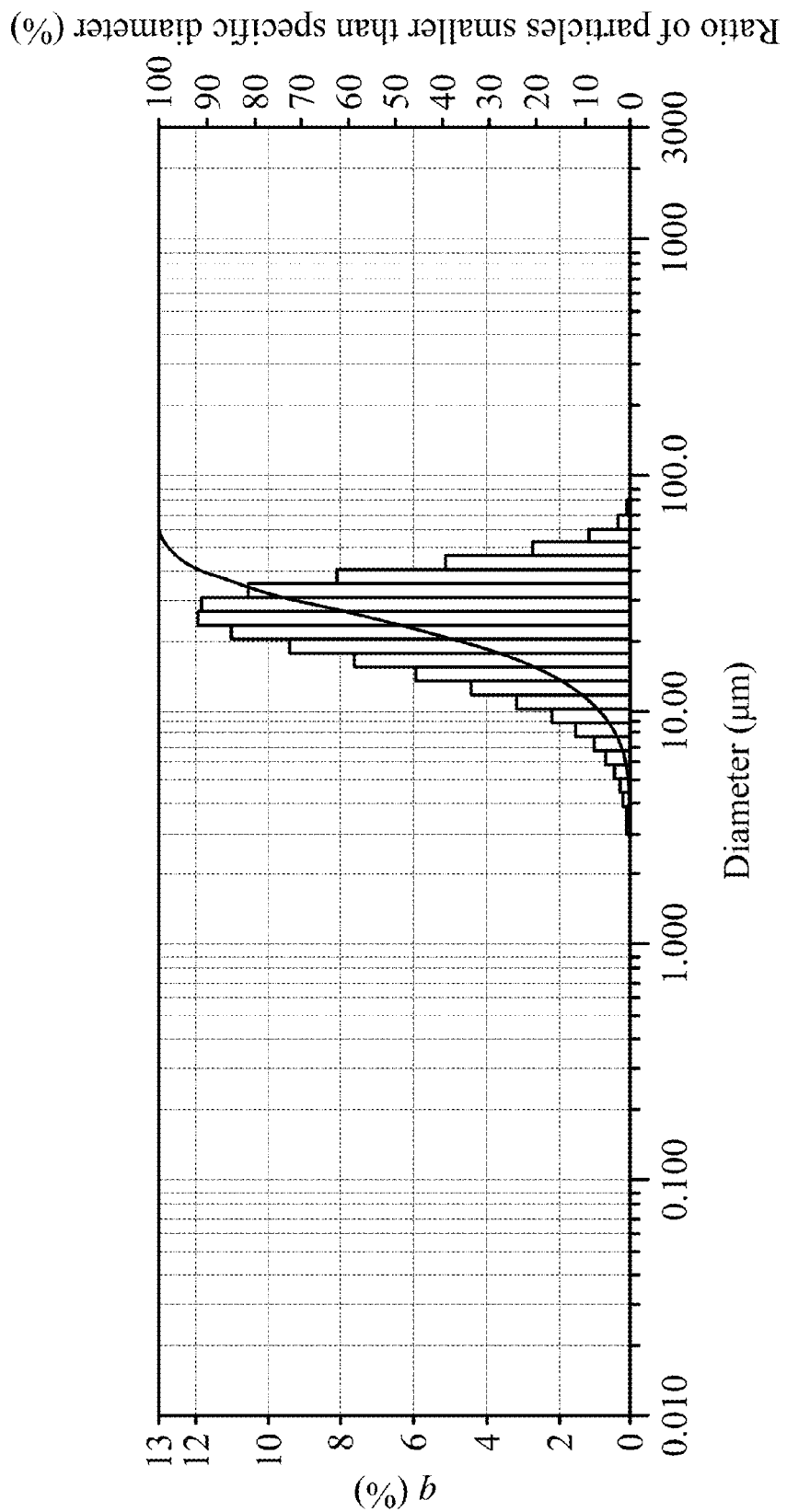
FIG. 2 shows a particle size distribution diagram of the silicon carbide powder before the reciprocating sublimation in one embodiment of the disclosure.
Figure 3:
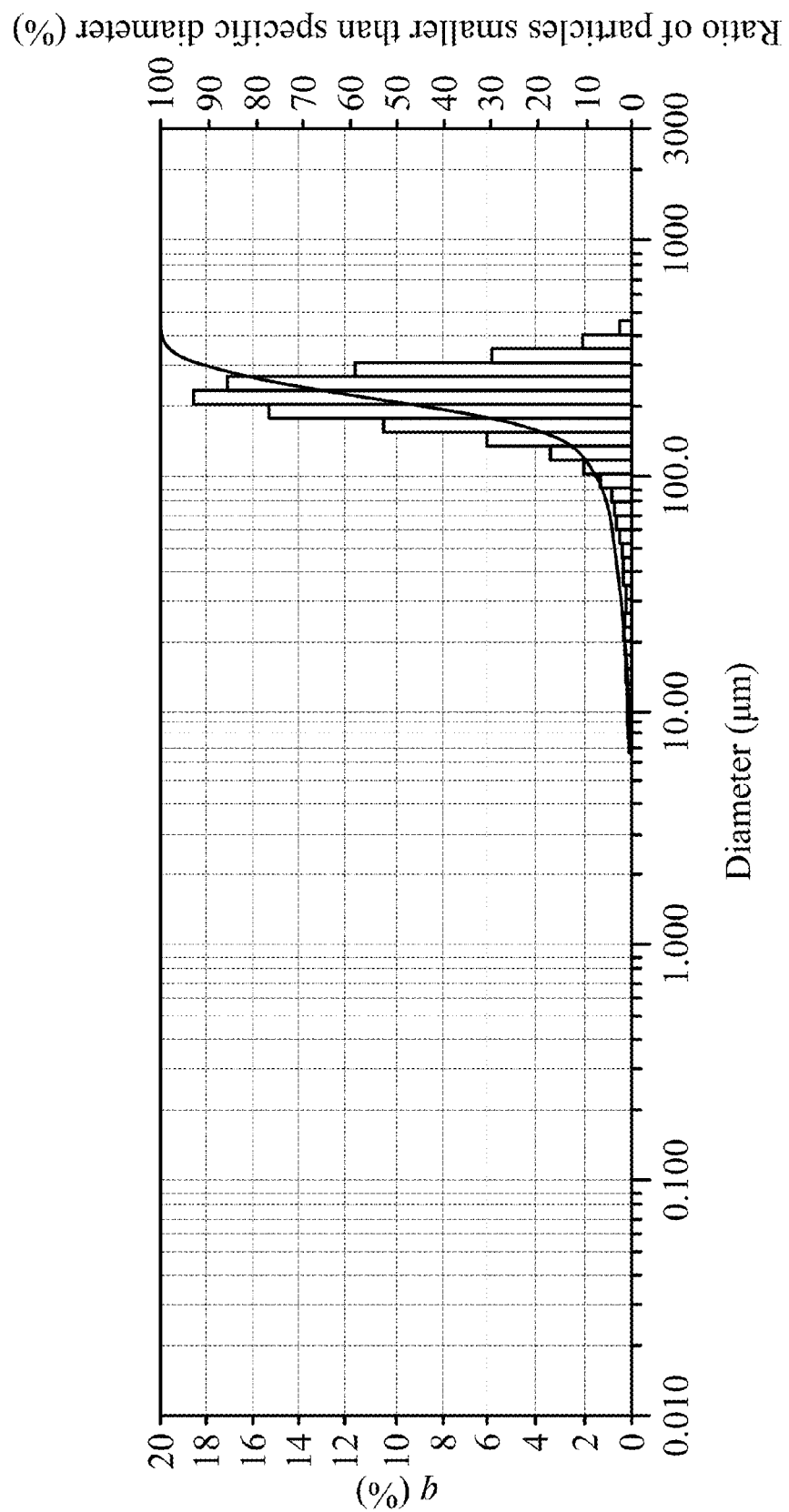
FIG. 3 shows a particle size distribution diagram of the silicon carbide powder after the reciprocating sublimation in one embodiment of the disclosure.

600 g of silicon oxide powder served as a silicon precursor, and 240 g of graphite powder served as carbon precursor, which were evenly mixed and then put into a graphite crucible. The mixture was vacuumed to 0.1 Torr, and then heated and kept at 1700° C. for 150 minutes under vacuum and non-oxygen condition, such that the silicon powder and the graphite powder reacted to form silicon carbide powder. The silicon carbide powder had a diameter of several hundreds of nanometers to several tens of micrometers, as shown in FIG. 1A. The silicon carbide powder was put into a graphite crucible, and argon of ultra-high purity was introduced into the graphite crucible at a temperature that was lower than 1000° C. The argon pressure in the graphite crucible was about 660 Torr, which served as a protective atmosphere. The silicon carbide powder in the non-oxygen condition was heated to 1900° C. to be annealed for 10 minutes, and then cooled to 1800° C. to be treated for 10 minutes. The heating/cooling circle (e.g. reciprocating sublimation) was repeated four times, and the product in the graphite crucible was cooled to room temperature. Micropowder was obtained, and its diameter growth is shown in FIG. 1B. The powder diameters and diameter distributions (measured by HORIBA laser diameter analyzer) before and after the reciprocating sublimation are dramatically different, as shown in FIG. 2 (before the reciprocating sublimation), FIG. 3 (after the reciprocating sublimation), and Table 1.

TABLE 1

| | Powder diameter before reciprocating sublimation (micrometer) | Powder diameter after reciprocating sublimation (micrometer) |
|---|---|---|
| $D_{10}$ | 11.6 | 119.4 |
| $D_{50}$ | 23.3 | 208.3 |
| $D_{90}$ | 38.9 | 295.2 |
| $D_{avg}$ | 24.5 | 207.7 |
| $D_{90}/D_{10}$ | 3.35 | 2.47 |

Figure 4A:
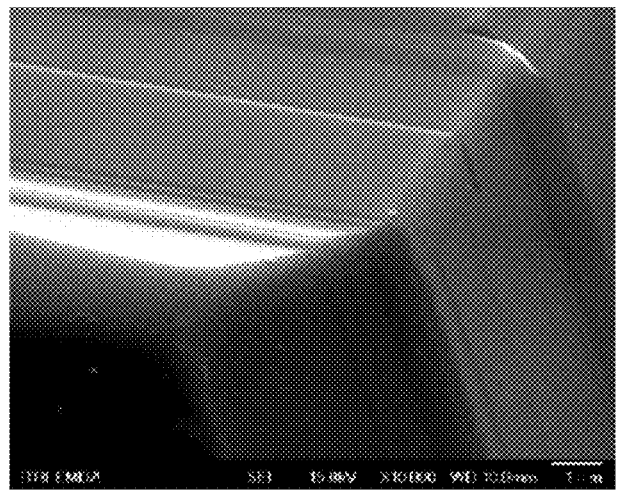
FIG. 4A shows a SEM photograph of the silicon carbide powder surface morphology before the reciprocating sublimation in one embodiment of the disclosure.
Figure 4B:
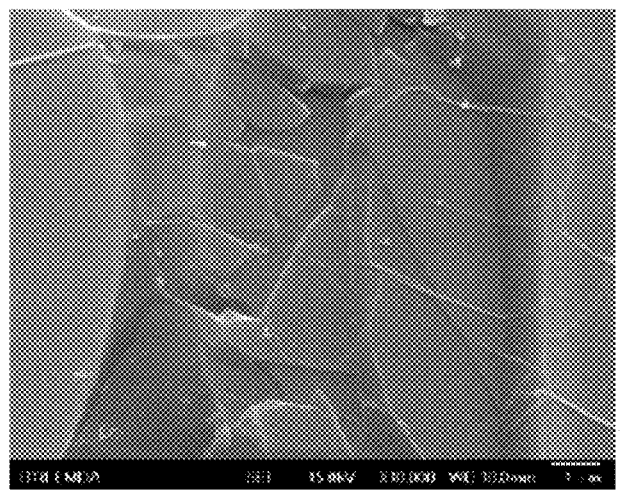
FIG. 4B shows a SEM photograph of the silicon carbide powder surface morphology after the reciprocating sublimation in one embodiment of the disclosure.
Figure 5:
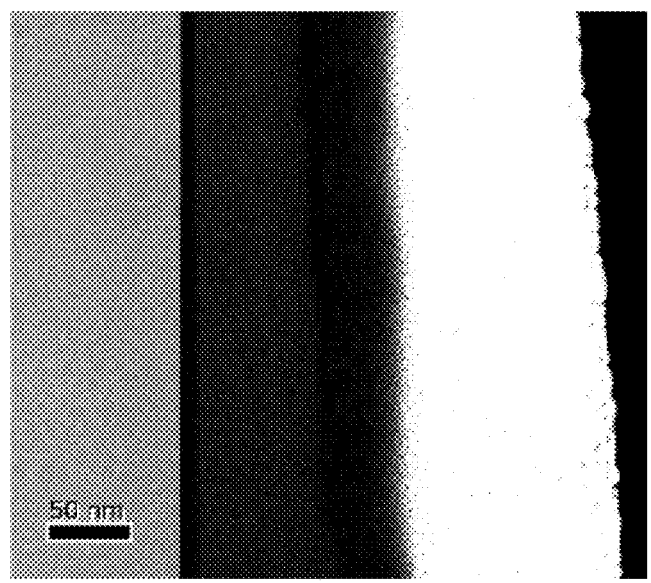
FIG. 5 shows a TEM photograph of interface between the thin film and silicon carbide powder after the reciprocating sublimation in one embodiment of the disclosure.
Figure 6:
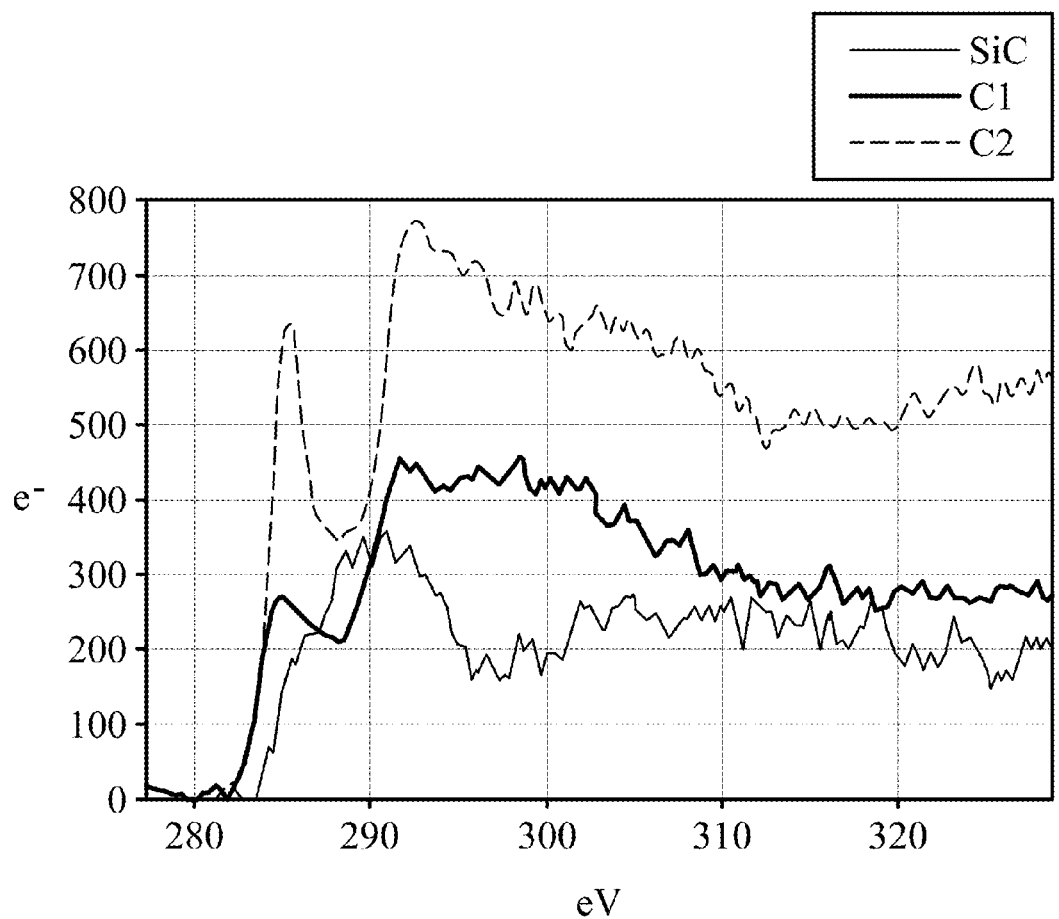
FIG. 6 shows an EELS spectrum of the thin film on the silicon carbide powder surface after the reciprocating sublimation in one embodiment of the disclosure.

The surface topographies of the powder before and after the reciprocating sublimation were observed using SEM. The powder before the reciprocating sublimation had a smooth surface (as shown in FIG. 4A), and the powder after the reciprocating sublimation had obvious patterns on its surface (as shown in FIG. 4B), which are dramatically different. The powder after the reciprocating sublimation was surveyed by TEM to observe its microscopic structure, which included a thin film with a thickness of about 80 nm on its surface, as shown in FIG. 5. The thin film in FIG. 5 is analyzed by EELS, which is mainly composed of carbon (different from the silicon carbide core of the powder), as shown in FIG. 6.

Example 2

Figure 7A:
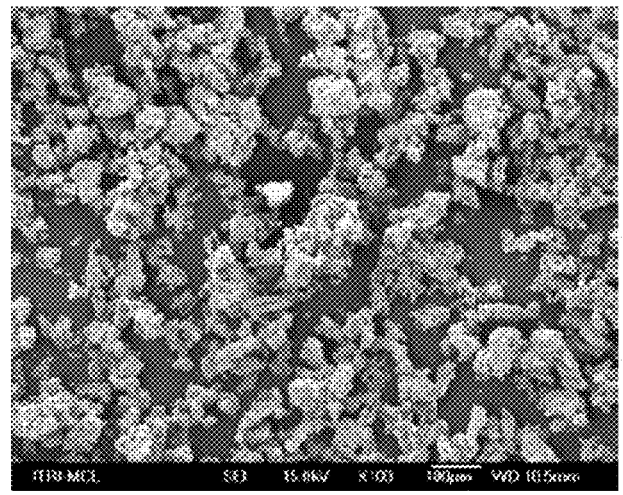
FIG. 7A shows a photograph of silicon carbide powder before reciprocating sublimation in one embodiment of the disclosure.
Figure 7B:
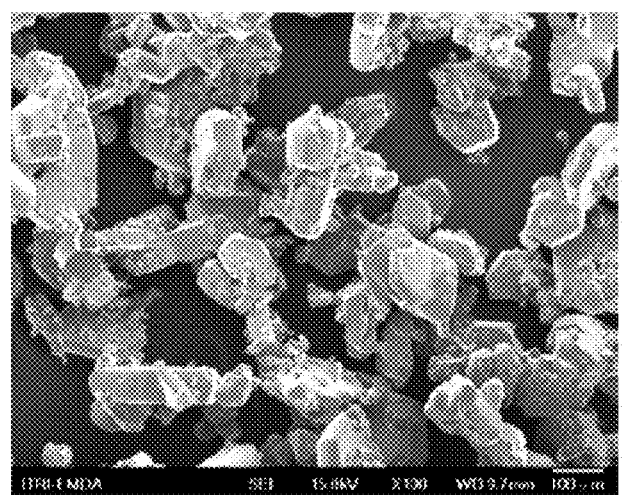
FIG. 7B shows a photograph of the silicon carbide powder after the reciprocating sublimation in one embodiment of the disclosure.
Figure 8:
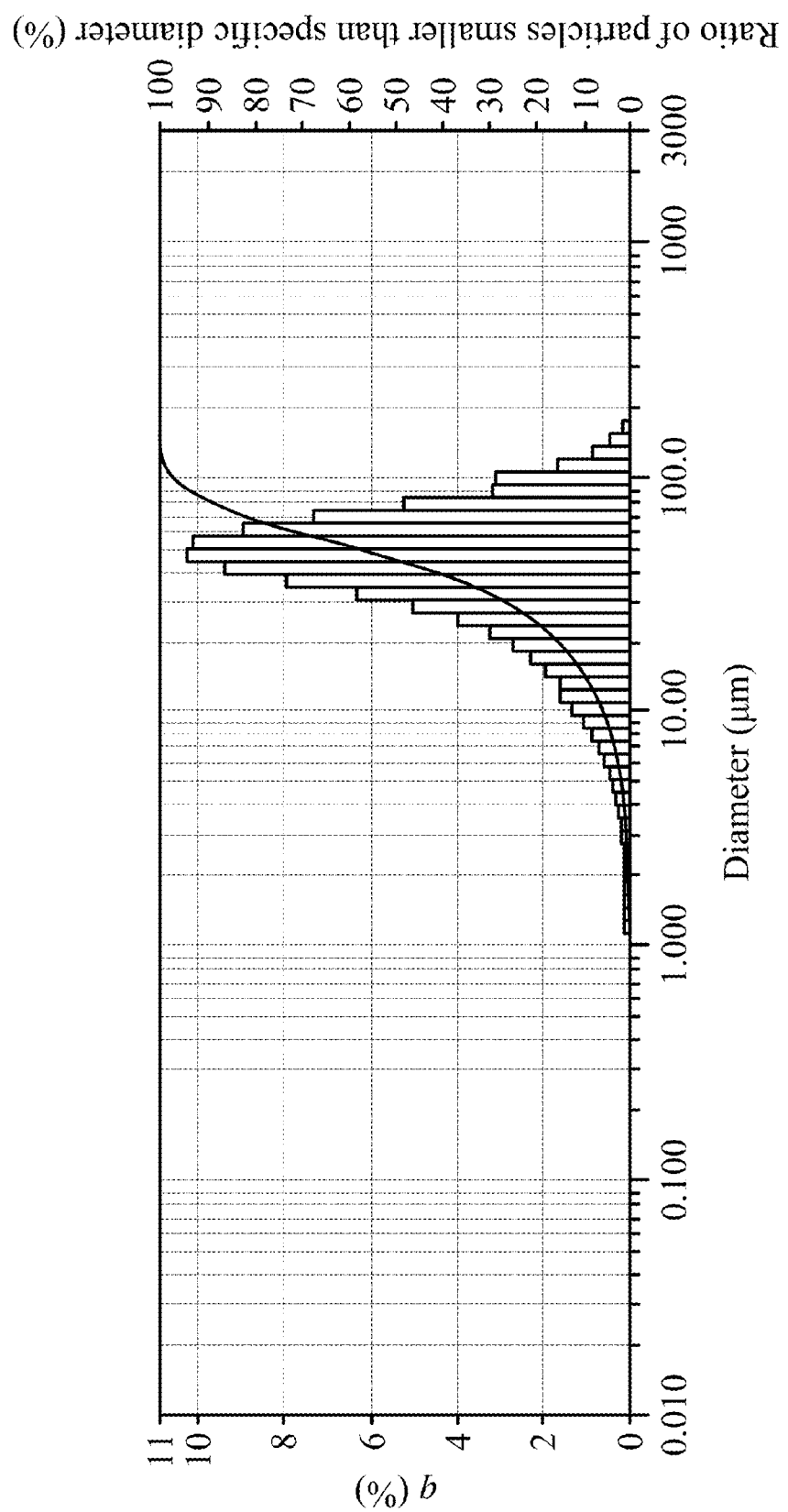
FIG. 8 shows a diameter distribution diagram of the silicon carbide powder before the reciprocating sublimation in one embodiment of the disclosure.
Figure 9:
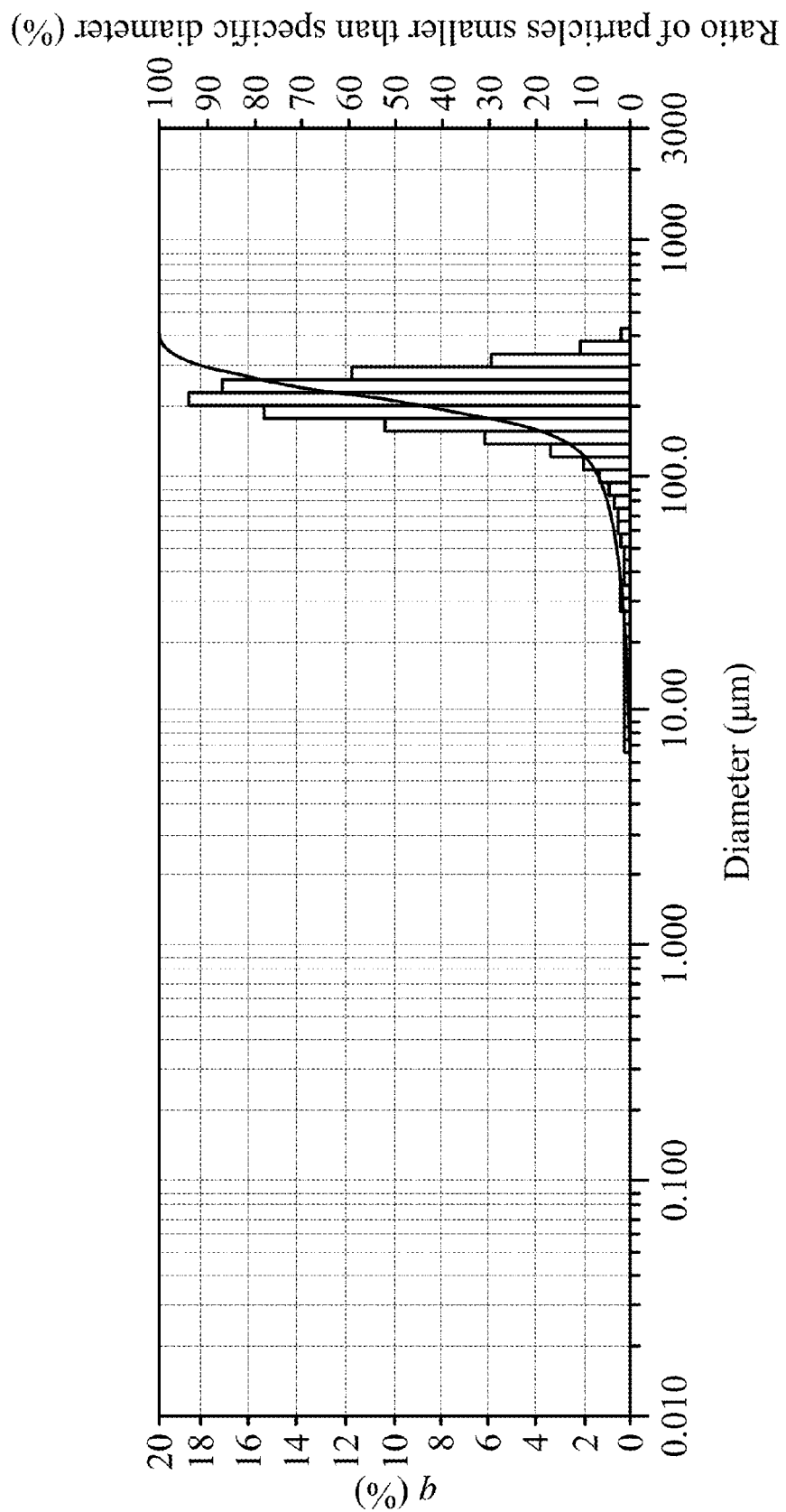
FIG. 9 shows a diameter distribution diagram of the silicon carbide powder after the reciprocating sublimation in one embodiment of the disclosure.

600 g of silicon oxide powder served as silicon precursor, and 240 g of graphite powder served as carbon precursor, which were evenly mixed and then put into a graphite crucible. The mixture was vacuumed to 0.1 Torr, and then heated and kept at 1720° C. for 150 minutes under vacuum and non-oxygen condition, such that the silicon powder and the graphite powder reacted to form silicon carbide powder. The silicon carbide powder had a diameter of several hundreds of nanometers to several tens of micrometers, as shown in FIG. 7A. The silicon carbide powder was put into a graphite crucible, and argon of ultra-high purity was introduced into the graphite crucible at a temperature that was lower than 1000° C. The argon pressure in the graphite crucible was about 660 Torr, which served as a protective atmosphere. The silicon carbide powder in the non-oxygen condition was heated to 1920° C. to be annealed for 10 minutes, and then cooled to 1820° C. to be treated for 10 minutes. The heating/cooling circle (e.g. reciprocating sublimation) was repeated four times, and the product in the graphite crucible was cooled to room temperature. Micropowder was obtained, and its diameter growth is shown in FIG. 7B. The powder diameters and diameter distributions (measured by HORIBA laser diameter analyzer) before and after the reciprocating sublimation are dramatically different, as shown in FIG. 8 (before the reciprocating sublimation), FIG. 9 (after the reciprocating sublimation), and Table 2.

TABLE 2

| | Powder diameter before reciprocating sublimation (micrometer) | Powder diameter after reciprocating sublimation (micrometer) |
|---|---|---|
| $D_{10}$ | 14.5 | 96.7 |
| $D_{50}$ | 44.0 | 195.5 |
| $D_{90}$ | 80.9 | 305.0 |
| $D_{avg}$ | 46.6 | 200.0 |
| $D_{90}/D_{10}$ | 5.58 | 3.15 |

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A method for manufacturing micropowder, comprising:
   (a) mixing a silicon precursor and a carbon precursor to form a mixture, and heating and keeping the mixture at 1600° C. to 1800° C. under a vacuum and non-oxygen condition for 120 to 180 minutes to form a silicon carbide powder; and
   (b) heating and keeping the silicon carbide powder at a first temperature of 1900° C. to 2100° C. under non-oxygen condition for 5 to 15 minutes, and then cooling and keeping the silicon carbide powder at a second temperature of 1800° C. to 2000° C. under the non-oxygen condition for 5 to 15 minutes to form micropowder, wherein the first temperature is higher than the second temperature,
   wherein the micropowder includes a silicon carbide core covered by a carbon film.

2. The method as claimed in claim 1, wherein step (b) is repeated several times.

3. The method as claimed in claim 2, wherein the step (b) is repeated several times for a total of 60 to 120 minutes.

4. The method as claimed in claim 1, wherein the vacuum and non-oxygen condition in step (a) has a pressure of 0.1 Torr to 50 Torr.

5. The method as claimed in claim 1, wherein the non-oxygen condition in step (b) includes an argon atmosphere with a pressure of 400 torr to 760 Torr.

6. The method as claimed in claim 1, wherein the carbon precursor comprises graphite, active carbon, asphalt, resin, alkane, alkene, or a combination thereof.

7. The method as claimed in claim 1, wherein the silicon precursor comprises silicon powder, silicon oxide powder, tetraethyl silicate, or a combination thereof.

* * * * *